(12) United States Patent
Hotta et al.

(10) Patent No.: US 6,538,309 B1
(45) Date of Patent: Mar. 25, 2003

(54) SEMICONDUCTOR DEVICE AND CIRCUIT BOARD FOR MOUNTING SEMICONDUCTOR ELEMENT

(75) Inventors: Yuji Hotta, Ibaraki (JP); Miho Yamaguchi, Ibaraki (JP); Akiko Matsumura, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/537,690

(22) Filed: Mar. 29, 2000

(30) Foreign Application Priority Data

Mar. 29, 1999 (JP) .......................... 11-087178

(51) Int. Cl.[7] .............................. H01L 23/02
(52) U.S. Cl. .................. 257/678; 257/787; 257/774
(58) Field of Search .................. 257/787, 700, 257/701, 774, 778, 697, 777, 702, 678

(56) References Cited

U.S. PATENT DOCUMENTS

| 5,719,440 | A | * | 2/1998 | Moden ........................ 257/697 |
| 5,834,335 | A | * | 11/1998 | Buschbom ................... 438/107 |
| 5,994,773 | A | * | 11/1999 | Hirakawa ..................... 257/702 |
| 5,998,874 | A | * | 12/1999 | Huber et al. ................. 257/774 |
| 6,097,094 | A | * | 8/2000 | Ishigami ...................... 257/763 |
| 6,191,477 | B1 | * | 2/2001 | Hashemi ...................... 257/706 |

FOREIGN PATENT DOCUMENTS

JP          63-86322          4/1988

* cited by examiner

Primary Examiner—Anh Mai
Assistant Examiner—Kyung Lee
(74) Attorney, Agent, or Firm—Sughrue Mion, PLLC

(57) ABSTRACT

A semiconductor device comprising an anisotropic conductive film and a semiconductor element, wherein the film is bonded to the element on the side comprising an electrode, such that the electrode is electrically connectable to an external circuit via a conductive path in the film. According to the present invention, a conventional mounting apparatus can be used for mounting a chip via ACF. Consequently, the productivity of the mounting process for producing a mounted structure of semiconductor element/ACF/circuit board can be improved.

9 Claims, 9 Drawing Sheets

SEMICONDUCTOR DEVICE AND CIRCUIT BOARD FOR MOUNTING SEMICONDUCTOR ELEMENT

FIELD OF THE INVENTION

The present invention relates to a novel semiconductor device and a novel circuit board that are used for efficient connection of a bare chip semiconductor element to a circuit board.

BACKGROUND OF THE INVENTION

In general terms, semiconductor elements, such as IC, are formed in great numbers on a wafer and cut into respective chips, each of which chips is connected to a circuit board. With an increasing number of ICs formed on a chip, the number of electrodes formed on the chip also increases, which in turn requires the shape and arrangement pattern of the electrodes to be finer and more narrow-pitched. In addition, a chip and a circuit board are not connected by a wire any more but by mating a conductor part of the circuit board to an electrode part of the chip (e.g., flip chip bonding). Alternatively, a naked chip may be mounted on a substrate (bare chip mounting).

When mating a conductor of the circuit board to an electrode of the chip, as mentioned above, an anisotropic conductive film may be used between the chip and the circuit board.

An anisotropic conductive film (hereinafter to be abbreviated as ACF) is anisotropic in terms of conductivity, because it is conductive in the direction penetrating the two sides of a film and insulating in the direction of expansion of the film surface.

When a chip is mounted via an ACF, the chip, the ACF and a circuit board are superimposed for alignment, and they need to be bonded simultaneously. However, alignment of these three members requires such a high manipulative technique that a simple chip mounting apparatus cannot be used. Consequently, the productivity of the mounting process becomes low.

It is therefore an object of the present invention to solve the problem in bonding the above-mentioned three members, thereby to improve productivity of the mounting process for connecting a semiconductor element and a circuit board via an anisotropic conductive film.

SUMMARY OF THE INVENTION

The present invention is characterized by the following embodiments.

A semiconductor device comprising an anisotropic conductive film and a semiconductor element, wherein the film is bonded to the element on the side comprising an electrode, such that the electrode is electrically connectable to an external circuit via a conductive path in the film.
(Embodiment A)

A semiconductor device comprising an anisotropic conductive film and a wafer carrying plural semiconductor elements thereon, wherein the film is bonded to all the semiconductor elements on the side comprising electrodes, such that the electrodes are electrically connectable to an external circuit via conductive paths in the film.
(Embodiment B)

A semiconductor device comprising a semiconductor element and an anisotropic conductive film, wherein an electrode of the element is bonded to or in contact with an end of a conductive path of the film, and at the contact point, the electrode is covered with aluminum and the conductive path is covered with gold, or the electrode is covered with a barrier metal and the conductive path is covered with solder.
(Embodiment C)

When the contact part or bonding part on the side of the conductive path is to be plated with gold, a nickel plating is preferably applied beforehand as the base plating.

A circuit board for mounting a semiconductor element, which comprises an anisotropic conductive film and a circuit board, wherein the film is bonded to the. circuit board on the side comprising the circuit, such that the circuit board is electrically connectable to the element via the film.
(Embodiment D)

A circuit board for mounting a semiconductor element, which comprises an anisotropic conductive film and a circuit board, wherein the circuit board is bonded to or in contact with an end of a conductive path of the film, and at the contact point, the circuit is made of solder and the conductive path is made of gold.
(Embodiment E)

In the present invention, the anisotropic conductive film comprises a film substrate made of an insulating resin and conductive paths. The conductive paths comprise metal conductor wires that are insulated from each other and that penetrate the film substrate in the thickness direction of the film. Moreover, the circuit board comprises an insulating substrate and a circuit for mounting. The circuit has a conductor pattern for connection with electrodes and is formed on one side of the substrate.

BRIEF DESCRIPTION OF THE DRAWINGS

FIG. 2 is a schematic view showing one embodiment of ACF used in the present invention, wherein FIG. 2(a) shows the film surface of ACF, with partial enlargement of the film surface to show an arrangement pattern of conductive paths, and FIG. 2(b) shows a section along the line X—X in FIG. 2(a).

DETAILED DESCRIPTION OF THE INVENTION

The semiconductor devices of the above Embodiments A and B are explained in the following.

Figure 1:
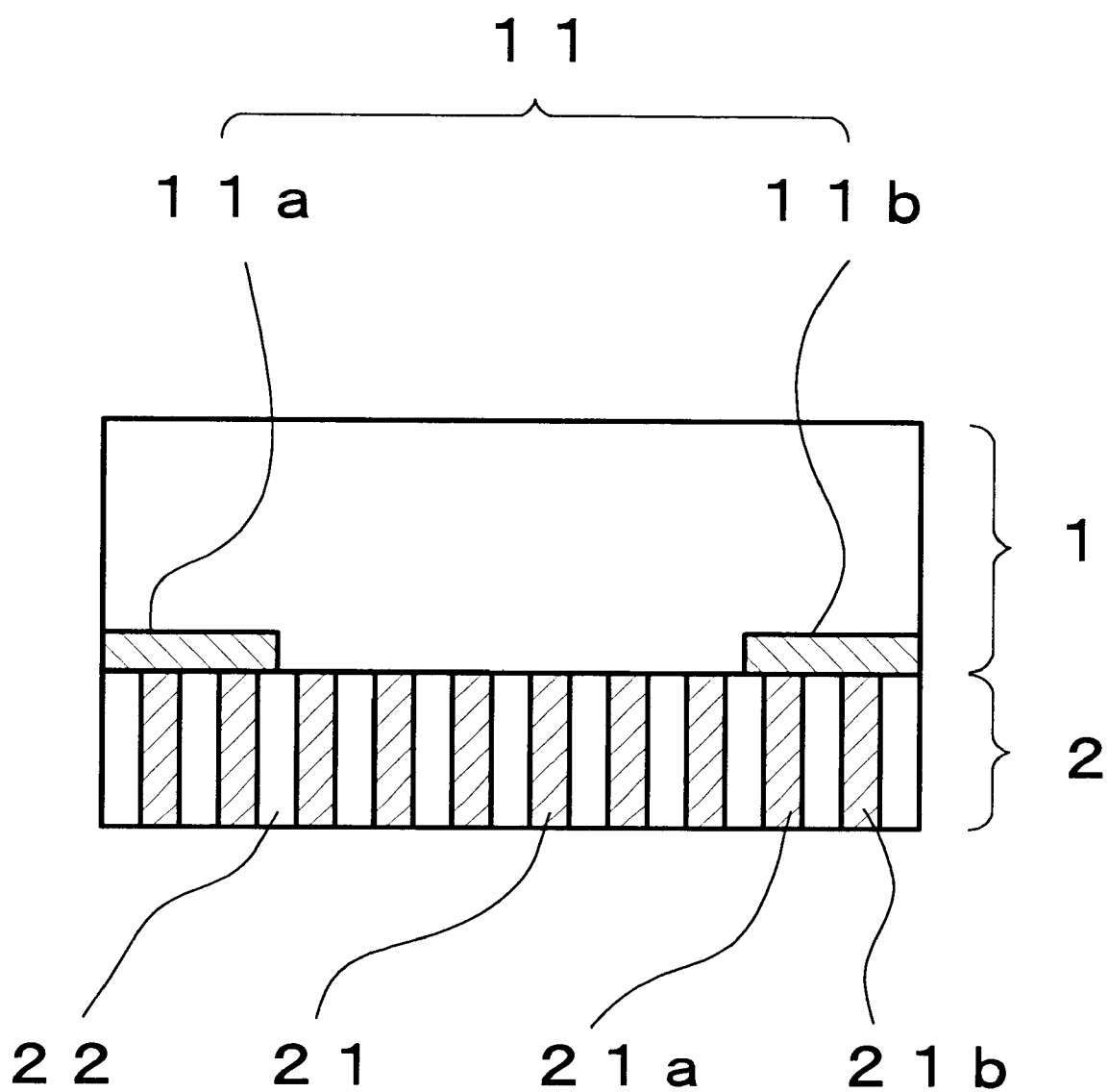
FIG. 1 is a cross section of the semiconductor device of the present invention, wherein the details of the internal structure of the semiconductor element 1 have been omitted and only the positional relationship between the electrode and the element is shown. The size ratio of each part has been altered for easy understanding and the hatching has been applied for demarcation.

The Embodiment A of the semiconductor device of the present invention as explained above comprises, as shown in FIG. 1, a bare chip (naked chip having a passivasion membrane) semiconductor element 1 and an ACF 2 integrally bonded to the side of the element 1 where electrodes 11 are present, to give a chip of the present invention. The electrodes 11 (11a, 11b are shown in FIG. 1) are connected to the ends of conductive paths 21 of the ACF 2. The mode of connection may be a mere contact or bond. In FIG. 1, conductive paths 21a, 21b are connected to the electrode 11b, whereby the semiconductor element 1 is electrically connected to an external circuit (e.g., circuit board) via ACF 2 to form a semiconductor device. The device can be handled just like the chip after dicing.

Due to this structure, a conventional mounting apparatus (e.g., flip chip bonder) can be used without special adjustment or adaptation, and the productivity of a three-layer structure of semiconductor element/ACF/circuit board obtained by the mounting process can be increased. As a result, a connected structure of chip, ACF and circuit board can be produced efficiently. The ACF to be used consists of metal conductor wires and an insulating resin and has an adequate elastic modulus. Hence, the chip. of the present invention capable of connection to an external circuit with high connection reliability can be produced.

The bare chip semiconductor element in the present invention may be any as long as it can be mounted on a circuit board via an ACF. However, the present invention is more effective when applied to an element comprising a number of electrodes that are set at a narrow pitch, such as a processor integrally comprising CPU, memory and various arithmetic circuits, rather than a single light emitting element.

As used herein, a semiconductor device embraces diced elements, as well as a combination of plural semiconductor elements formed on a wafer and a single ACF bonded thereto. This type of semiconductor device may be considered a precursor before dicing or a device capable of connection to an external circuit with or without dicing. This type of semiconductor device is the Embodiment B.

A circuit board on which the semiconductor device is to be mounted in the present invention may be any as long as it has a conductor to mount the semiconductor device, such as a flexible circuit board and a rigid circuit board. This circuit board at least has, on one surface of the insulating substrate, a conductor pattern corresponding to the electrode pattern of the element, so that the bare chip semiconductor element can be mounted. The circuit board may be connected to a circuit formed inside a substrate or any other part thereof, or may have a lead contact, a bump contact and the like.

Figure 2:
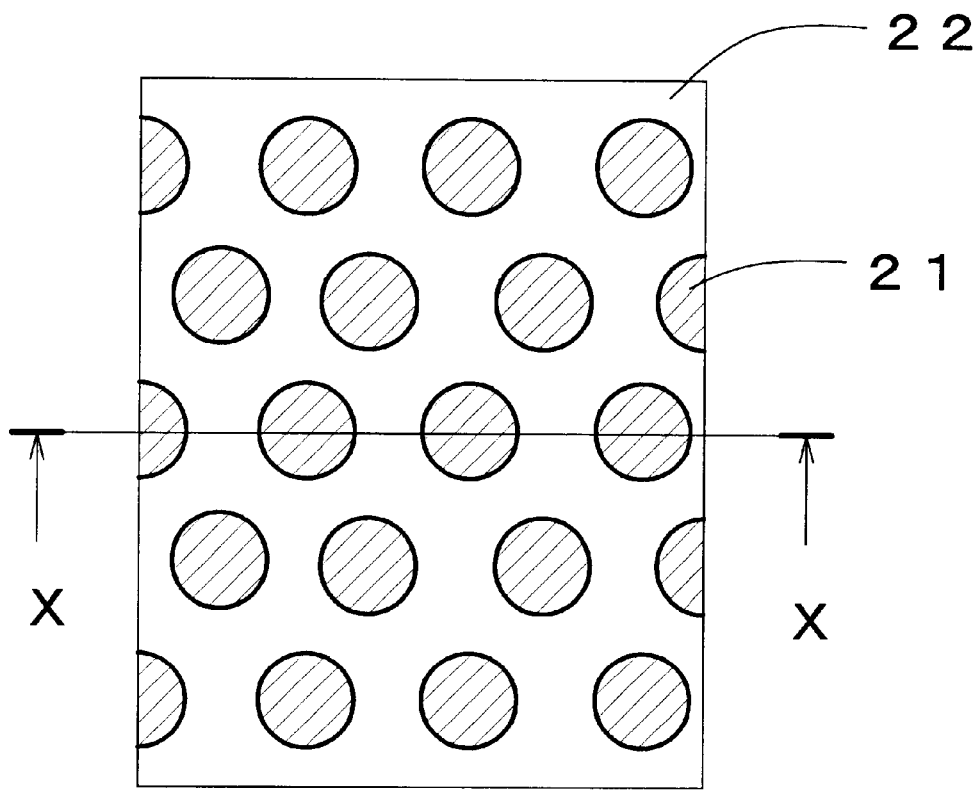
Figure 2:
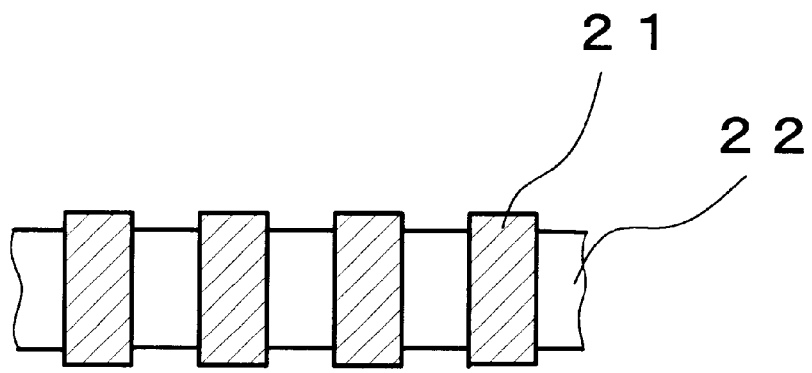

The ACF constituting the semiconductor device of the present invention has a structure wherein a film substrate 22 made of an insulating resin comprises plural conductive paths 21 made of metal conductor wires, as shown in FIG. 2. The conductive paths are insulated, each from the other, and penetrate the film substrate 22 in the thickness direction.

Figure 3:
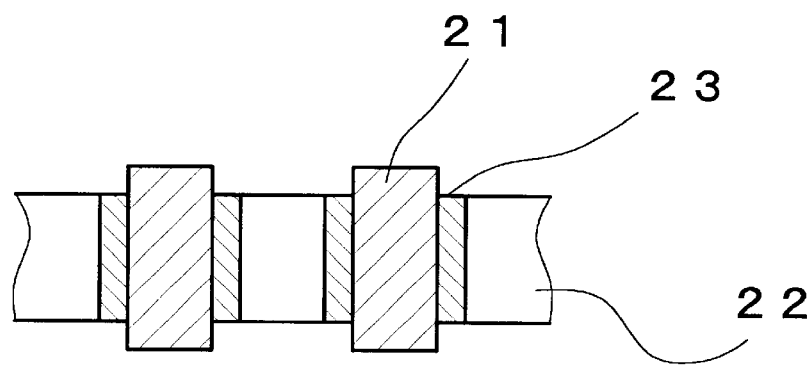
FIG. 3 is a schematic view showing another embodiment of ACF used in the present invention.
Figure 4:
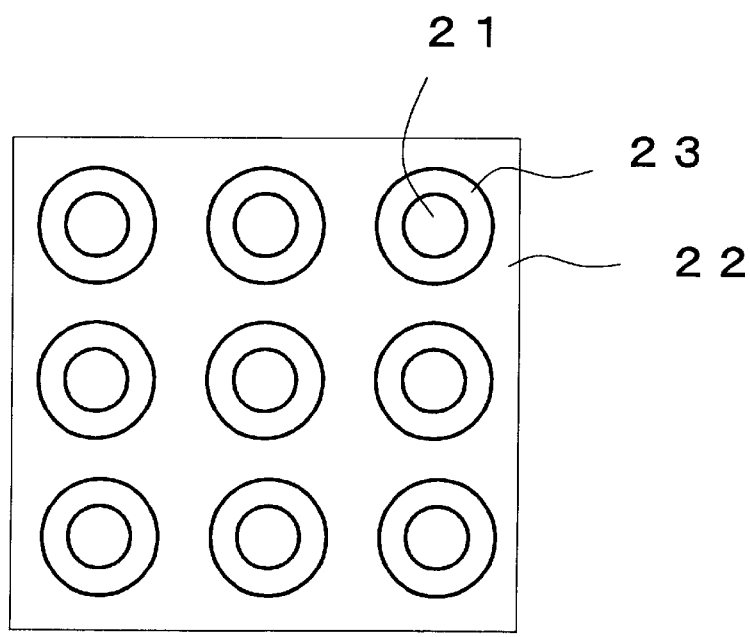
FIG. 4 shows one example of the arrangement pattern of conductive paths of ACF used in the present invention. Shown is a partial enlargement of the film surface as in FIG. 2(a) without a showing of the periphery.

In the embodiment shown in FIG. 3 and FIG. 4, an additional layer 23 made from a different material is formed between the film substrate 22 and the conductive path 21. This layer may consist of plural layers and the material thereof may be appropriately determined in consideration of insulating property, conductivity and the like for desired use and object. For example, in FIG. 3, the resin material of the film substrate 22 may have high adhesiveness and the layer 23 surrounding the conductive path 21 may have high heat resistance and high insulating property.

The insulating resin for a film substrate may be, for example, thermosetting resin, thermoplastic resin and the like. Examples thereof include thermoplastic polyimide resin, epoxy resin, polyetherimide resin, polyamide resin, phenoxy resin, acrylic resin, polycarbodiimide resin, fluorocarbon resin, polyester resin, polyurethane resin, polyamideimide resin and the like, which are selected according to object. These resins may be used alone or in combination.

The film substrate has a thickness of about 10 $\mu$m–200 $\mu$m, particularly about 25 $\mu$m–150 $\mu$m, to afford higher reliability and a thinner device.

The metal conductor wire constituting the conductive path is preferably made of copper, gold, aluminum, nickel and the like, particularly preferably copper and gold for superior conductivity. In addition, a metal conductor wire made to conduct electricity, such as the copper wire defined in JIS C 3103, is preferable. Using such wire, a conductive path superior in electric properties, mechanical properties and economic aspect can be obtained.

The shape and size of the section (perpendicular to the direction of conductive path), as well as the number of the paths are appropriately determined in conformity with the electrode of a chip. To cope with a fine pitch electrode arrangement pattern at a pitch of 50 $\mu$m or below, an outer diameter of the path of 5–30 $\mu$m is preferable. The conductive path may have a circular or polygonal cross section, or any other cross sectional shape, as long as the above-mentioned size condition is met. It is preferable that about 1 to 3 conductive paths be connected to one electrode of a chip.

The end of a conductive path may protrude from, recede from or may be on the same level with the surface of a film substrate, or combinations of these states. The state of one end of the film substrate does not bind the state of the other end. The ends of the conductive paths may vary according to the electrode to be connected to or the circuit board to be mounted. In general, the electrode of a chip and the conductor of a circuit board to be mounted are mostly pads having small irregularities. As shown in FIG. 2(b), therefore, the conductive path preferably protrudes from the both sides of the film substrate to ensure highly reliable connection.

When the end of a conductive path protrudes from the film surface, the height of the protrusion is preferably about 0.01 $\mu$m–5 $\mu$m, particularly about 0.1 $\mu$m–3 $\mu$m, to achieve high connection reliability. The conductive path can be made to protrude from the film substrate in the following manner.

That is, to make the end of a conductive path protrude from the film substrate, a metal having high conductivity and high corrosion resistance, such as gold, nickel and the like, is applied to the end. The material of conductive path, particularly, the material covering the end to be in contact with a semiconductor element, may be any that is suitable for contact with the electrode of the semiconductor element. For example, combinations of aluminum (electrode side) and gold (conductive path side), barrier metal (electrode side) and solder (conductive path side) and the like can be employed. The barrier metal constitutes a layer for preventing diffusion between Al used for wiring in an element and an external metal. Examples thereof include simple substances of Cr, Au, Ni and the like, alloy and the like.

When an end of the conductive path is to be coated with a different metal, a metal capable of improving adhesion of the coating metal to the conductive path and of improving the quality of the coating is preferably applied as a base metal. When a conductive path made of copper is plated with gold, for example, it is plated with nickel first and then with gold.

The conductive paths are preferably arranged densely within a film substrate. The arrangement pattern of the conductive paths, when seen from the film surface, is in a closest packed state as shown in FIG. 2(a), forming a square matrix as shown in FIG. 4, or may be in a randomly dense state, with preference given to a closest packed state for connection with a fine electrode.

A film substrate comprising a number of metal conductor wires penetrating the film substrate as conductive paths can be obtained by fixing a number of insulating wires bundled densely in an inseparable manner and slicing the wire bundle in a desired film thickness in the direction forming an angle with the insulating wires. The ACF of the present invention is most desirably prepared according to a production process including the following steps (1) to (4) or steps (1) to (3) and (5).

(1) Step wherein a metal conductor wire having a diameter of conductive path (e.g., 10–50 $\mu$m) is coated with an insulating resin to form one or more insulating layers to give an insulating wire, and wound around a core to give a coil.

(2) Step wherein the above-mentioned coil is heated and/or pressed to integrally weld and/or compression-bond the coating layers of the insulating wire to give a coil block.

(3) Step wherein the above-mentioned coil block is sliced in a desired thickness in the direction forming an angle with the insulating wires to give a film.

(4) Step wherein the above-mentioned film is etched at the insulating resin to allow exposure of the metal conductor wire from the film plane.

(5) Step to deposit a metal on an exposed end of the metal conductor wire to form a protrusion from the film plane.

The above-mentioned steps (1) to (3) enable the most efficient dense bundling of the insulating wires and easily produce the closest packed collective pattern of the conductive paths, as shown in FIG. 2(a). Subsequent to the above-mentioned steps (1) to (3), the above-mentioned step (4) or (5) may be added according to the selected process for protruding a conductive path.

According to the above-mentioned production process, a coating layer formed on the metal conductor wire ultimately constitutes a film substrate. It is also possible to form plural layers on the surface of a metal conductor wire according to a desired use, such as for insulation, adhesion and the like. The ACF thus obtained can show variation in electrical properties and mechanical properties, such as conductivity, dielectric property, insulating property, adhesiveness, strength and the like, in the direction of expansion of the film plane. Reference may be made to WO98/07216 entitled "Anisotropic conductive film and process thereof" for each step of (1) to (5) of the above-mentioned production process.

When a semiconductor element and an ACF are to be bonded, the connection (i.e., contact, bonding and the like) between the conductive path and the electrode of the semiconductor element should be highly reliable. To achieve this, the entirety of the ACF needs to have an adequate elasticity. An ACF shows anisotropic elastic modulus like anisotropic conductivity, because the elastic modulus differs between the film thickness direction and the film plane direction. In the present invention, the preferable elastic modulus of the ACF as a whole is defined to be that in the direction of film surface. The preferable elastic modulus is 0.1–5 GPa in the temperature range of from 25° C. to 125° C., in view of connection reliability after application of a thermal cycle.

The elastic modulus of ACF as a whole varies depending on the material of conductive path, sectional shape and length of conductive path, density and arrangement pattern of conductive paths, the material of film substrate, thickness of film substrate and the like. These factors are determined as appropriate to make the elastic modulus fall within the desired range.

An electrode and a conductive path may be bonded by deposition of metal or may be merely in contact with each other according to the bonding state of the semiconductor element and ACF. A semiconductor element and an ACF may be bonded by the adhesive strength of the material of a film substrate wherein an electrode and a conductive path may be in simple contact. Alternatively, an electrode and a conductive path may be welded to keep the semiconductor element and the ACF bonded, or a semiconductor element and an ACF may be bonded by concurrent utilization of the adhesive strength of a film substrate and welding of the electrode and the conductive path.

By a material having an adhesive strength is meant a material that shows adhesiveness as it is or upon pressurization, or a material that does not adhere as it is but acquires adhesive property upon heating with or without pressurization. Examples of the latter material include thermoplastic resin, thermosetting resin and the like.

When a semiconductor element and an ACF are bonded, an ACF having a size corresponding to the element may be used. More preferably, however, a single sheet of ACF having a size sufficiently covering a wafer carrying plural semiconductor elements, e.g., the same size as wafer, is bonded, and having ensured the connection between electrodes of each element and the corresponding conductive paths, the semiconductor elements are diced into respective chips together with ACF. This method is highly productive and affords highly reliable bonding. The semiconductor elements before dicing, when considered as one device, is the Embodiment B mentioned above.

The circuit boards of the above-mentioned Embodiments D and E are explained in the following. These circuit boards are for mounting a semiconductor element (hereinafter to be also referred to as a circuit board for mounting).

Figure 5:
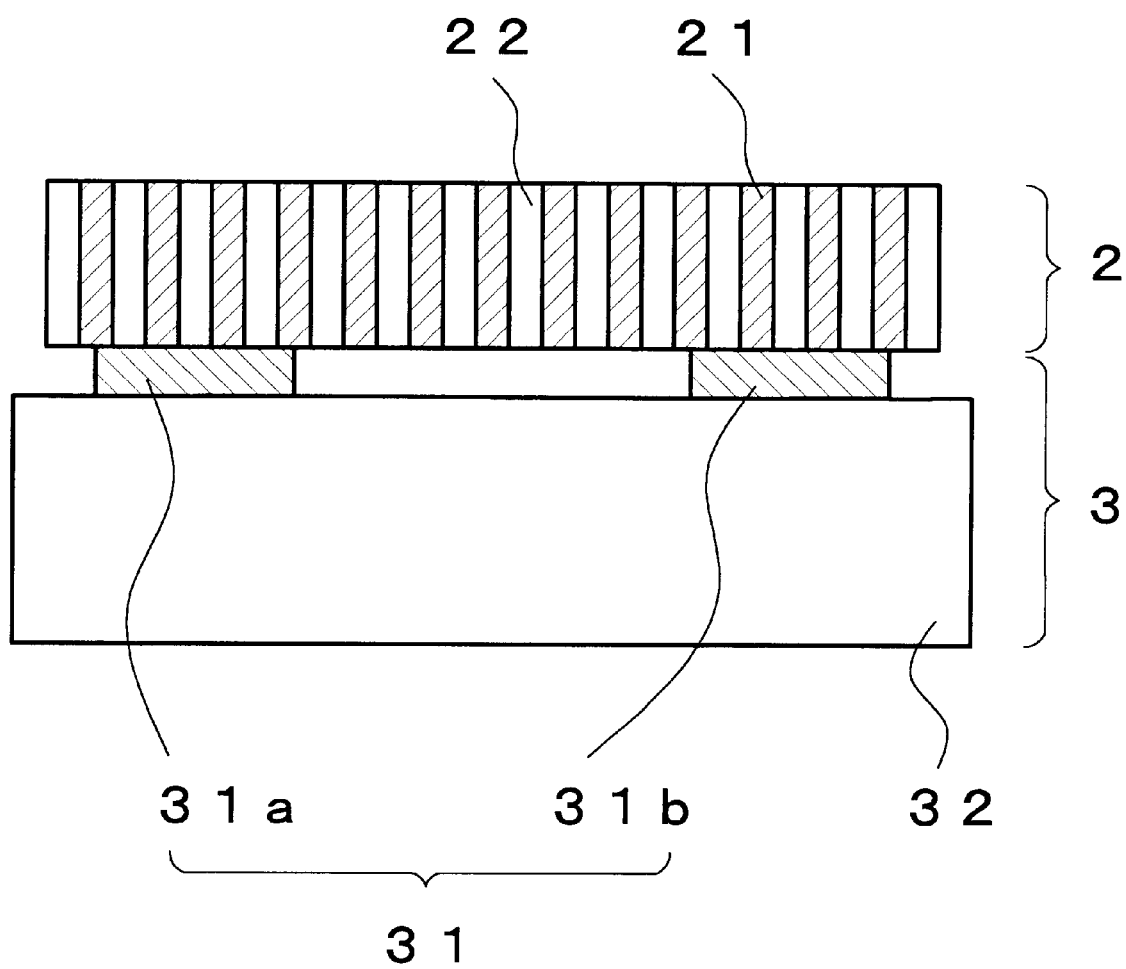
FIG. 5 is a cross section of the circuit board for mounting in the present invention, wherein the internal structure of a circuit board 3, the structure of an interlayer connection and the like have been omitted to only show the position of a circuit 31 to be connected to ACF. The circuit 31 has been drawn thick for better understanding, creating a gap between ACF 2 and the circuit board 3, but there is no actual gap.
Figure 6:
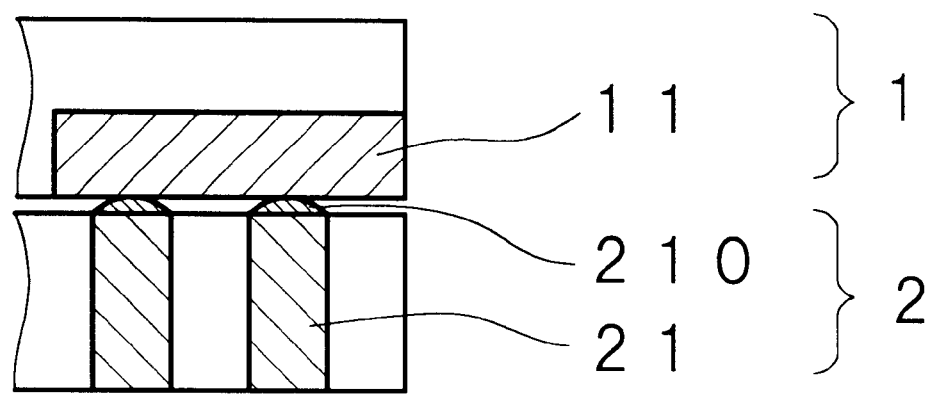
FIGS. 6(a) and (b) are cross-sectional views of the semiconductor device, and show that the electrode 11 is made of aluminum and the conductive path 21 is covered with gold 210.
Figure 6:
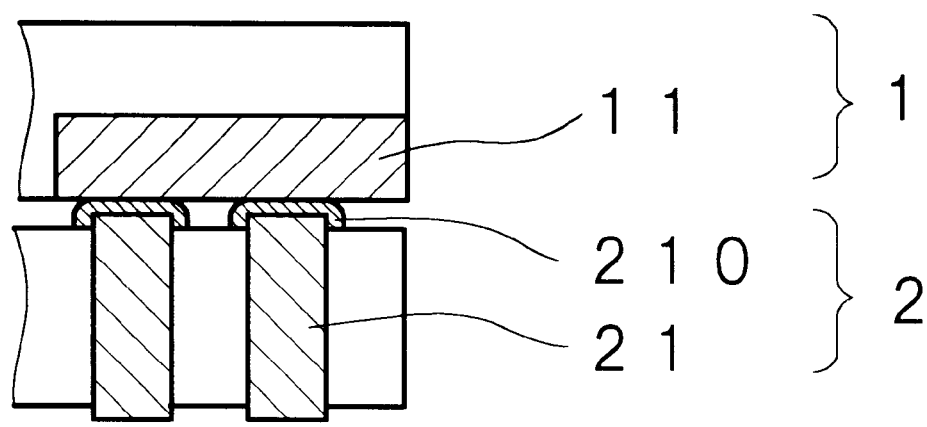
Figure 7:
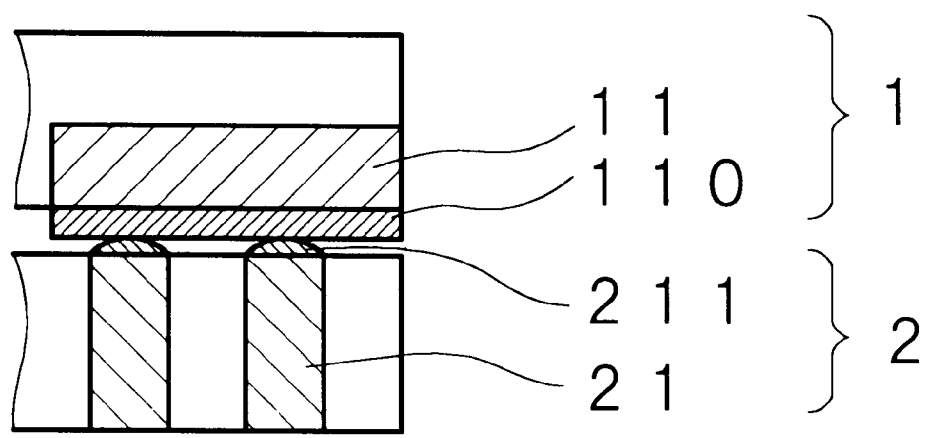
FIGS. 7(a) and (b) are cross-sectional views of the semiconductor device, and show that the electrode 11 is covered with a barrier metal 1 10 and the conductive path 21 is covered with solder 211.
Figure 7:
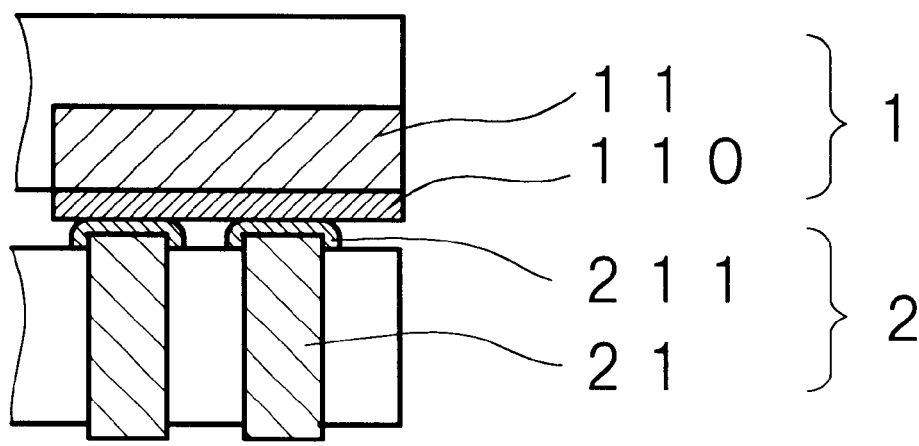
Figure 8A:
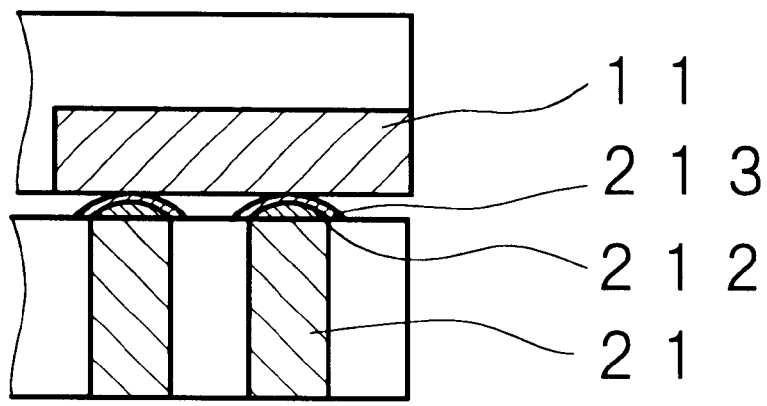
FIGS. 8(a) and (b) are cross-sectional views of the semiconductor device, and show that the conductive path 21 is plated with nickel 212 and then with gold 213.
Figure 8B:
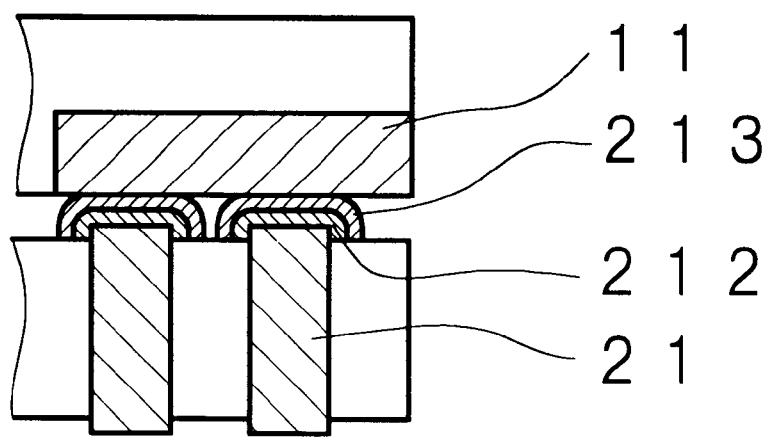
Figure 9:
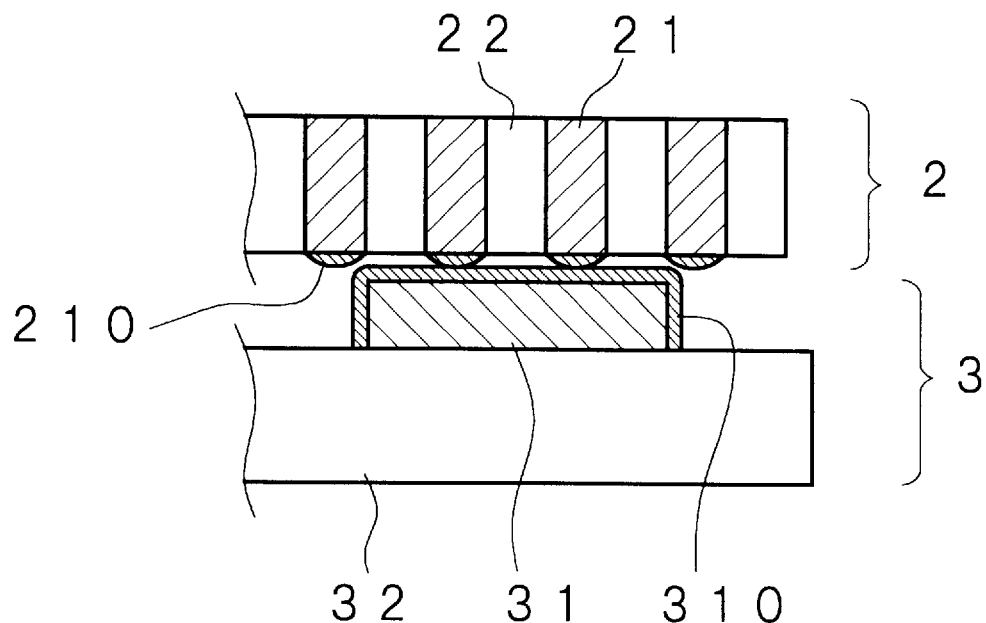
FIGS. 9(a) and (b) are cross-sectional views of the circuit board, and show that the circuit 31 is covered with solder 310 and the conductive path 21 is covered with gold 210.
Figure 9:
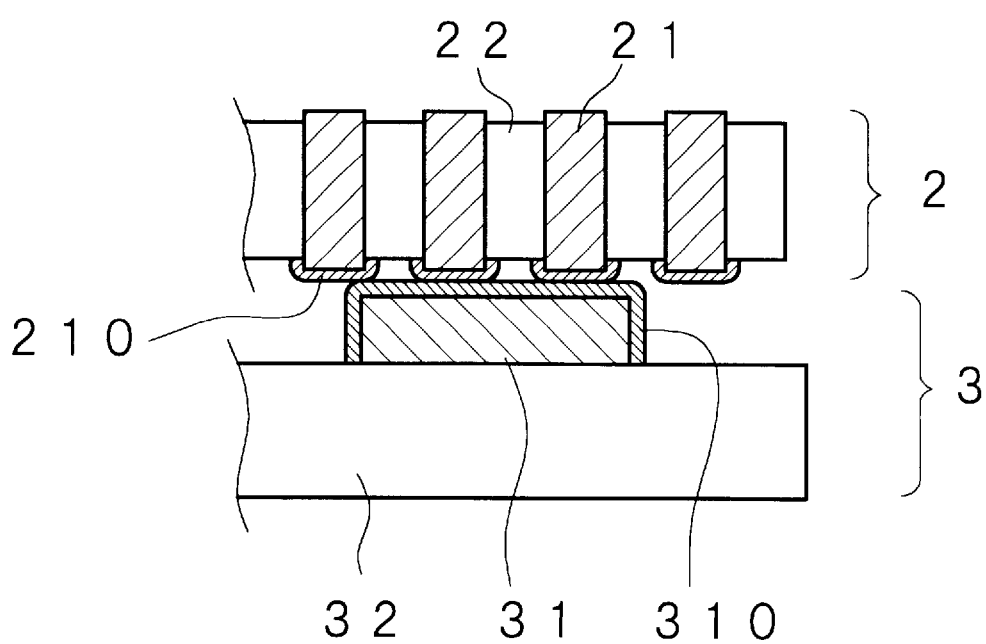
Figure 10:
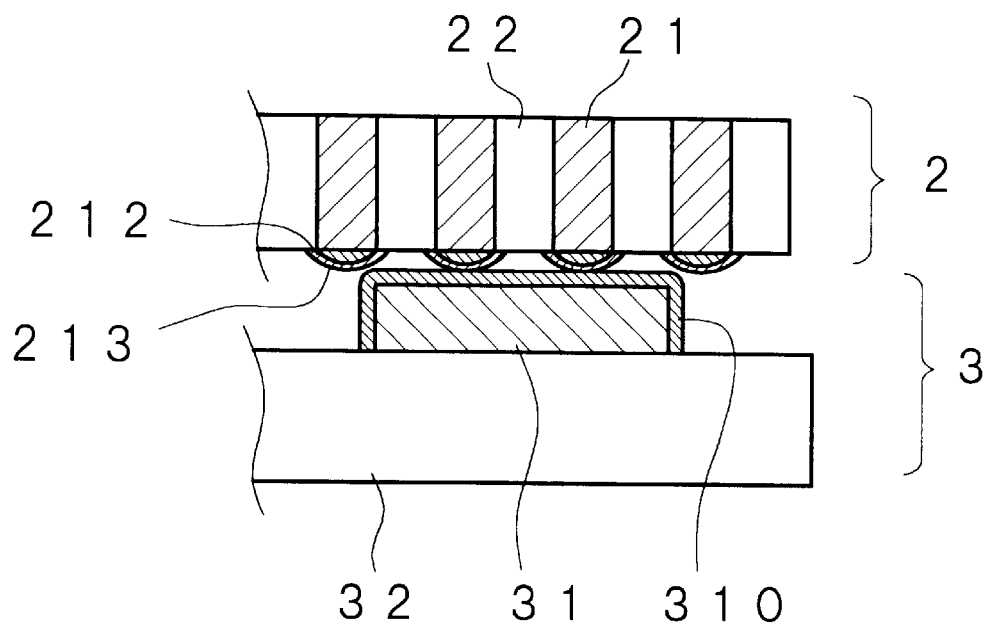
FIGS. 10(a) and (b) are cross-sectional views of the circuit board, and show that the conductive path 21 is plated with nickel 212 and then with gold 213.
Figure 10:
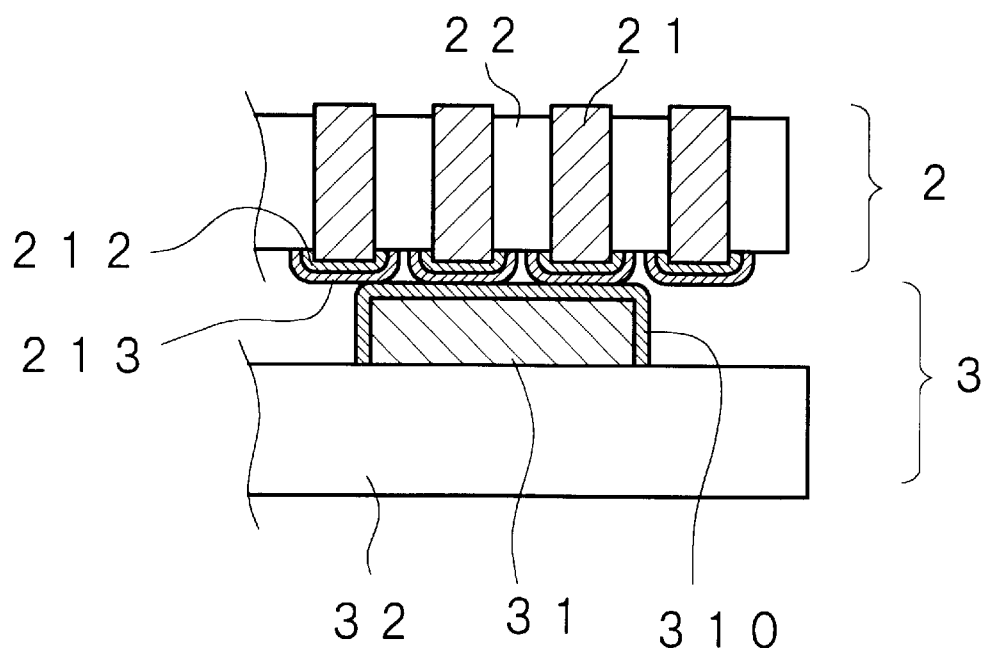

The circuit board for mounting in the present invention consists of, as shown in FIG. 5, a circuit board 3 and an ACF 2 bonded thereto. The circuit board 3 consists of an insulating substrate 32 and a circuit for mounting 31 formed thereon. The circuit 31 has a conductor pattern to be connected to the electrode of a bare chip semiconductor element. The circuit board 3 is contacted or bonded to an end of a conductive path 21 of ACF 2, whereby a bare chip can be mounted on the circuit board 3 via ACF 2.

This constitution permits use of a conventional mounting apparatus, such as a flip chip bonder and the like, as in the case of Embodiment A. Consequently, mounting process can be performed without fail and a chip-ACF-circuit board connected structure can be produced efficiently. The connection reliability of chip is high, as in the above-mentioned Embodiment A, due to the advantageous characteristic of ACF.

The ACF and the circuit board constituting the inventive circuit board for mounting, and the bare chip semiconductor element to be mounted on the inventive circuit board are as explained for the above-mentioned Embodiment A. The ACF as a whole has an elastic modulus that is necessary for bonding the semiconductor element, ACF and circuit board, as explained for the above-mentioned Embodiment A. ACF and a circuit board are bonded and the conductive path and circuit for mounting are connected in the same manner as in the above-mentioned Embodiment A referring to the bonding of an ACF and a semiconductor element and the connection between a conductive path and an electrode.

The present invention is explained in more detail in the following by way of Examples, but the present invention is not limited by these examples.

EXAMPLE 1

This example is a realization of the above-mentioned Embodiment A, wherein an ACF having a large area covering all the semiconductor elements formed on a wafer was bonded, and the connected product was diced to give each element, whereby a semiconductor device of the present invention was afforded. ACF was prepared by the process including the above-mentioned steps (1) to (4).

Semiconductor Element

The element comprised an 8 inch diameter disc of silicon wafer substrate and 10 mm×10 mm semiconductor elements (integral circuits) formed thereon in a matrix. The electrodes of the elements were flat Al pads.

ACF

ACF consisted of a film substrate made of a polycarbodiimide resin and 18 $\mu$m diameter copper wires penetrating the film to form conductive paths.

The film substrate had a thickness of 60 $\mu$m and both ends of the conductive path protruded from the surfaces of the film. The amount of protrusion was the same for the both ends and 0.5 $\mu$m. The oxide film was removed by etching and the surface of the protruded conductive path was plated with nickel (4 $\mu$m), and then with gold (0.1 $\mu$m). Consequently, the total length of one conductive path was about 62 $\mu$m (=total thickness of ACF). The ACF and the wafer substrate had the same outer shape and ACF covered every semiconductor element formed on the wafer substrate.

The insulated conductive wires wound when producing ACF consisted of a 18 $\mu$m diameter copper wire and a coating of a polycarbodiimide resin thereon. The conductive paths collectively formed a nearly closest packed state, as shown in FIG. 2(a), created by the line-up winding, wherein the distance between the central axes of the adjacent two conductive paths was 40 $\mu$m. The elastic modulus of the ACF in the film plane direction was 3.0 GPa.

The above-mentioned ACF was superimposed on a silicon wafer substrate carrying the above-mentioned semiconductor element matrix, covered with a fluorocarbon film, placed in an autoclave and heated at 200° C., 10 kgf to allow adhesion to the wafer. The device obtained at this stage is the semiconductor device of the above-mentioned Embodiment B, wherein all electrodes are connectable to an external circuit via ACF.

The resulting semiconductor device comprising ACF bonded to the elements formed on a wafer was diced into respective semiconductor devices (10 mm×10 mm each) using a dicing machine, whereby a semiconductor device of the above-mentioned Embodiment A was obtained.

The semiconductor device (Embodiment A) could be mounted on a mating circuit board using a flip chip bonder, which is a conventional mounting apparatus. As a result, a three-layer structure of semiconductor element/ACF/circuit board was obtained with high productivity. The connection state between the semiconductor element and circuit board via ACF showed an incidence of continuity failure of 0/200 in a thermal cycle test (−25° C. to 125° C.).

EXAMPLE 2

This example realizes the above-mentioned Embodiment D wherein ACF is bonded to a circuit board on the side containing a circuit (21 $\mu$m-thick solder plating applied to circuit surface). ACF was prepared by the process including the above-mentioned steps (1) to (4), as in Example 1.

Semiconductor Element to be Mounted

The element was a bare chip integral circuit having a thickness of 370 $\mu$m and outer shape of 10 mm×10 mm. Electrodes were flat Al pads.

Circuit Board

The circuit board comprised a 1 mm-thick glass epoxy substrate (FR-4) and a copper circuit pattern formed thereon. The circuit pattern corresponded to the electrodes of the semiconductor element to be mounted. The width of the circuit pattern was 100 $\mu$m and the width of the gap between adjacent circuits was 100 $\mu$m.

ACF was the same as the one shown in Example 1 in the structure and production method. The size of this film was 10 mm×10 mm in agreement with the outer shape of the chip to be mounted.

The above-mentioned ACF was put on the area where elements were set in the above-mentioned circuit board (where chips were bonded) and bonded by a flip chip bonder to give a circuit board for mounting of the present invention. The film was bonded at 180° C. for 20 sec at load 20 kgf. When using the flip chip bonder, a fluorocarbon film was applied to the head of the bonder (to be in contact with chip) to utilize only its bonding function.

The above-mentioned bare chip semiconductor element was suitably mounted on the above-mentioned circuit board for mounting, using a conventional mounting apparatus, flip chip bonder. As a result, a three-layer structure of semiconductor element/ACF/circuit board was obtained with high productivity, as in Example 1. The connection state between the semiconductor element and circuit board via ACF was fine as in Example 1.

According to the present invention, a conventional mounting apparatus can be used for mounting a chip via ACF. Consequently, the productivity of the mounting process for producing a mounted structure of semiconductor element/ACF/circuit board can be improved.

What is claimed is:

1. A chip semiconductor device consisting of an anisotropic conductive film and a semiconductor element in the stage of a bare chip, the anisotropic conductive film comprising a film substrate made of an insulating resin and conductive paths comprising metal conductor wires that are insulated from each other and that penetrate the film substrate in the thickness direction of the film, wherein the film is bonded to the element on the side comprising an electrode to form an assembly prior to connecting with an external circuit, such that the electrode is electrically connectable to said external circuit via a conductive path in the film.

2. The semiconductor device of claim 1, wherein the electrode and an end of the conductive path are in contact with or bonded to each other and, at the contact point, the electrode is made of aluminum and the conductive path is covered with gold, or the electrode is cover with a barrier metal and the conductive path is covered with solder.

3. A wafer semiconductor device consisting of an anisotropic conductive film and a wafer carrying plural semiconductor elements thereon, the anisotropic conductive film comprising a film substrate made of an insulating resin and conductive paths comprising metal conductor wires that are insulated from each other and that penetrate the film substrate in the thickness direction of the film, wherein the film is bonded to all the semiconductor elements on the side comprising electrodes to form an assembly prior to dicing the wafer so as to divide the elements, and prior to connecting with an external circuit, such that the electrodes are electrically connectable to said external circuit via conductive paths in the film.

4. The semiconductor device of claim 3, wherein the electrode and an end of the conductive path are in contact with or bonded to each other and, at the contact point, the electrode is made of aluminum and the conductive path is covered with gold, or the electrode is covered with a barrier metal and the conductive path is covered with solder.

5. The semiconductor device of claim 4, wherein the end of the conductive path is plated with nickel and then with gold.

6. The semiconductor device of claim 3, wherein the wafer with the anisotropic conductive film is diced, such that plural semiconductor elements constitute respective chips, thereby attaining the semiconductor device of claim 1.

7. A circuit board for mounting a semiconductor element, which consists of an anisotropic conductive film and a circuit board, the anisotropic conductive film comprising a film substrate made of an insulating resin and conductive paths comprising metal conductor wires that are insulated from each other and that penetrate the film substrate in the thickness direction of the film, and the circuit board comprising an insulating substrate and a circuit for mounting having a conductor pattern for connection with electrodes and formed on one side of the substrate, wherein the film is bonded to a semiconductor mounting side of the circuit board to form an assembly prior to attachment to a semiconductor element, such that the circuit is electrically connectable to the element via the film.

8. The circuit board of claim 7, wherein the circuit for mounting and an end of the conductive path are in contact with or bonded to each other and, at the contact point, the circuit is covered with solder and the conductive path is covered with gold.

9. The circuit board of claim 8, wherein the end of the conductive path is plated with nickel and then with gold.

* * * * *